United States Patent
Cha

(10) Patent No.: US 6,656,851 B1
(45) Date of Patent: *Dec. 2, 2003

(54) METHOD FOR FORMING ISOLATION FILM

(75) Inventor: Young-Kuk Cha, Cheongju (KR)

(73) Assignee: Hynix Semiconductor, Inc., Kyoungki-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 79 days.

(21) Appl. No.: 09/223,377

(22) Filed: Dec. 30, 1998

(30) Foreign Application Priority Data

Aug. 31, 1998 (KR) .............................. 98-35700

(51) Int. Cl.[7] .............................. H01L 21/302
(52) U.S. Cl. ................ 438/745; 438/750; 438/751; 438/754
(58) Field of Search ................ 438/700, 745, 438/753, 756, 757, 750, 751, 706, 710, 424, 444

(56) References Cited

U.S. PATENT DOCUMENTS

| 5,433,794 A | * | 7/1995 | Fazan et al. ................ 148/33.3 |
| 5,480,832 A | | 1/1996 | Miura et al. ................. 438/67 |
| 5,728,621 A | | 3/1998 | Zheng et al. ................ 438/247 |
| 5,940,716 A | * | 8/1999 | Jin et al. .................... 438/424 |
| 5,989,977 A | * | 11/1999 | Wu .......................... 438/431 |
| 5,998,278 A | * | 12/1999 | Yu ............................ 438/424 |

* cited by examiner

Primary Examiner—Robert Kunemund
Assistant Examiner—Lan Vinh
(74) Attorney, Agent, or Firm—Birch, Stewart, Kolasch & Birch, LLP

(57) ABSTRACT

The method for forming an isolation film in a semiconductor device includes the steps of providing a semiconductor substrate having at least a first insulation film formed thereon, and forming a trench in the first insulation film and the semiconductor substrate. Next, an insulation film pattern is formed. The insulation film pattern fills the trench and extends from the trench over a portion of the first insulation film. Afterwards, the first insulation film is etched. The etching of the first insulation film also results in etching of the insulation film pattern, but the insulation film pattern at the upper side wall edges of the trench is not etched.

22 Claims, 4 Drawing Sheets

METHOD FOR FORMING ISOLATION FILM

BACKGROUND OF THE INVENTION

1. Field of the Invention

The present invention is directed to a method for forming an isolation film in a semiconductor substrate which can isolate devices.

2. Description of the Background Art

As device densities increase dimensions decrease and device, it is more difficult to efficiently and reliably carry out an isolation process for isolating active devices. A trench process has been generally used as an isolation process for isolating the active devices on the grounds that it is sufficiently planarized, does not result in a have a bird's beak and prevents or minimizes a field thinning oxide effect as compared with a LOCOS process.

However, if an insulating material filling the trench is etched, the insulating material on peripheral edges of the trench is removed. As a result, there is formed a trench having a profile that which is not planarized is formed. The removal of materials on the peripheral edges causes current leakage between the active regions. This is called a 'corner effect'. FIGS. 1A–1H are respective cross-sectional views illustrating a conventional method for forming an isolation film in a semiconductor device. As shown in FIG. 1A, a first insulation film 2 and a second insulation film 3 are sequentially formed on a semiconductor substrate 1. Then, a photoresist film pattern 4 is formed on the second insulation film 3. The first insulation film 2 and the second insulation film 3 are an oxide film and a nitride film, respectively.

As illustrated in FIG. 1B, an upper portion of the semiconductor substrate 1 is exposed by sequentially etching the second insulation film 3 and the first insulation film 2 using the photoresist film as a mask. This forms a trench on the upper portion of the semiconductor substrate 1. Then, the photoresist film 4 is removed. As shown in FIG. 1C, a trench 5 is formed by etching the exposed semiconductor substrate 1 using the patterned second insulation film 3 as a hard mask.

As illustrated in FIG. 1D, a third insulation film 6 is formed on an inner surface of the trench 5. The third insulation film 6 is an oxide film formed by the thermal oxidation method or the chemical vapor deposition method. The thickness of the third insulation film 6 is similar to that of the first insulation film 2. As shown in FIG. 1E, a fourth insulation film 7 is formed on the semiconductor substrate 1 including the inside of the trench 5. That is, the trench 5 is filled with the fourth insulation film 7. The fourth insulation film 7 is composed of one of TEOS (tetra-ethyl orthosilicate), CVD-oxide, BPSG (boronphosphorous silicate glass), a combination of nitride and oxide, and oxidized polysilicon.

As illustrated in FIG. 1F, etch-back or chemical mechanical polishing is carried out on the fourth insulation film 7 until a surface of the second insulation film 3 is exposed.

As shown in FIG. 1G, the second insulation film 3 is then removed by a wet etching. In this phase, a portion of the fourth insulation film 7 protrudes above an upper surface of the semiconductor substrate 1, and has vertical side portions. As illustrated in FIG. 1H, the first insulation film 2 is removed by dry etching or chemical mechanical polishing. During this etching process, however, side walls of the third and fourth insulation films 6 and 7 are etched leaving a gap between a portion of the sidewalls for the fourth insulation film 7 and the sidewalls for the trench 5 (see dotted circles in FIG. 1H).

According to the conventional method for forming an isolation film as described above, a loss of insulating material occurs at the peripheral edges of the trench. In an attempt to lessen the insulating material loss, a thermal treatment is carried out after filling the trench. This lowers the etching ratio of the fourth insulation film 7, but even so, does not prevent the insulating material loss.

The insulation profile of FIG. 1H has a disadvantage in that, when a word line is formed as a next process step, an electrode material is formed on the peripheral edges of the trench and an electric field concentrates there. This rapidly deteriorates a gate insulation film, and current leakage takes place.

SUMMARY OF THE INVENTION

One object of the present invention is to provide a method for forming an isolation film in a semiconductor substrate which prevents insulating material from being lost at the peripheral edges of the trench.

This and other objects are achieved by providing a method for forming an isolation film in a semiconductor device, comprising the steps of: providing a semiconductor substrate having at least a first insulation film formed thereon; forming a trench in the first insulation film and the semiconductor substrate; forming an insulation film pattern which fills the trench and extends from the trench over a portion of the first insulation film; and etching the first insulation film.

BRIEF DESCRIPTION OF THE DRAWINGS

The present invention will become better understood with reference to the accompanying drawings which are given only by way of illustration and thus are not limitative of the present invention, and wherein.

DETAILED DESCRIPTION OF THE INVENTION

A method for forming an isolation film in a semiconductor device in accordance with an embodiment of the present invention will now be described in detail with reference to the accompanying drawings.

FIGS. 2A to 2I are respective cross-sectional views illustrating the method for forming the isolation film in the semiconductor device according to the embodiment of the present invention.

Figure 1A:
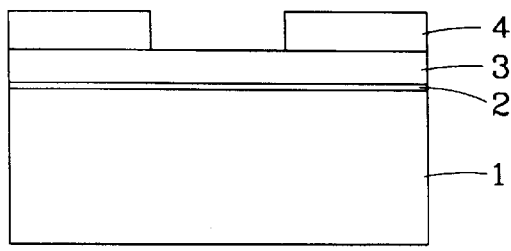
FIGS. 1A to 1H are respective cross-sectional views illustrating a conventional method for forming an isolation film in a semiconductor device.
Figure 1B:
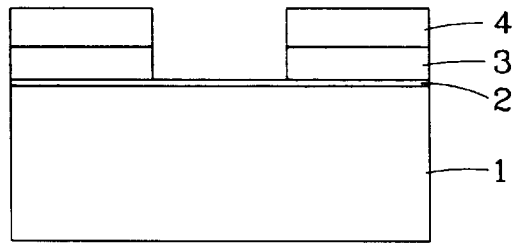
Figure 1C:
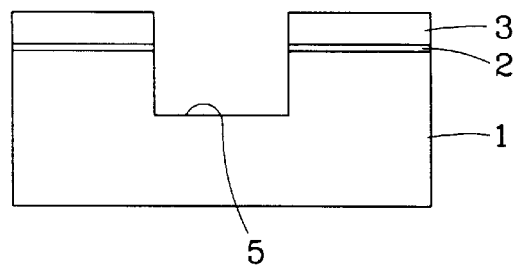
Figure 1D:
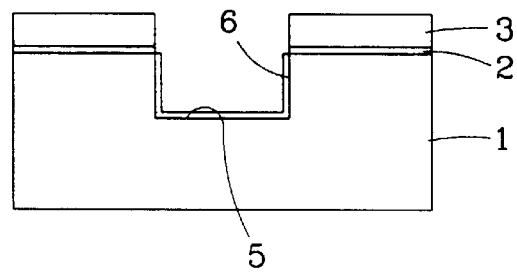
Figure 1E:
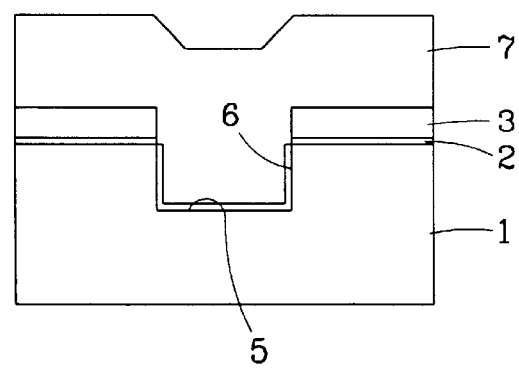
Figure 1F:
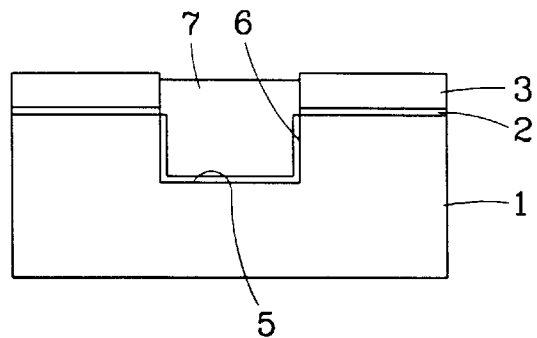
Figure 1G:
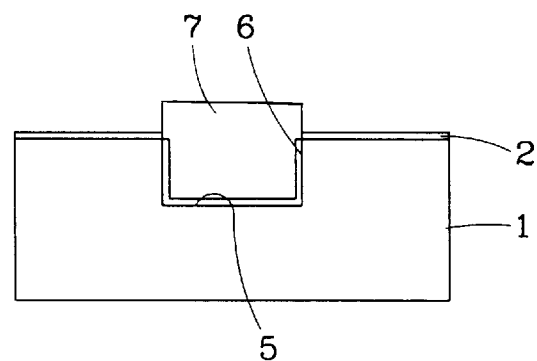
Figure 1H:
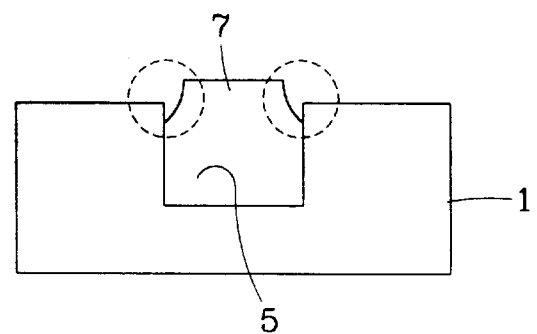
Figure 2A:
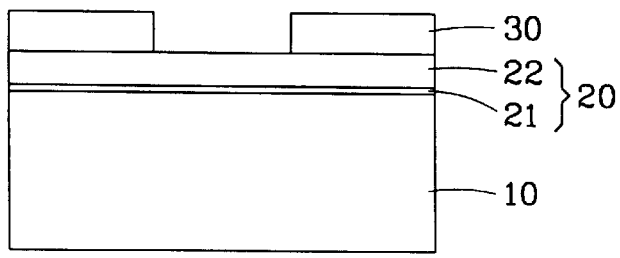
FIGS. 2A to 2I are respective cross-sectional views illustrating a method for forming an isolation film in a semiconductor device in accordance with embodiment of the present invention.

As shown in FIG. 2A, a first insulation film 20 is formed on a semiconductor substrate 10, and a photoresist film pattern 30 is formed on the first insulation film 20. The first insulation film 20 includes an oxide film 21 and a nitride film 22 on the oxide film 21.

Figure 2B:
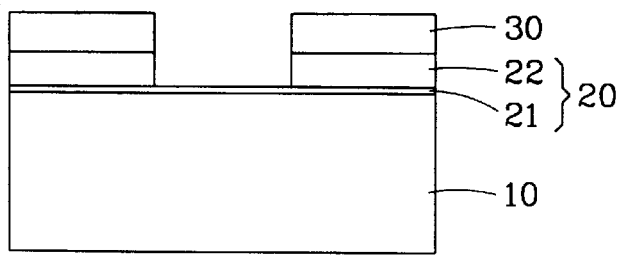

As illustrated in FIG. 2B, an upper portion of the semiconductor substrate 10 is exposed by etching the first insulation film 20 by employing the photoresist film pattern 30 as a mask. This forms a trench on the upper portion of the semiconductor substrate 10.

Figure 2C:
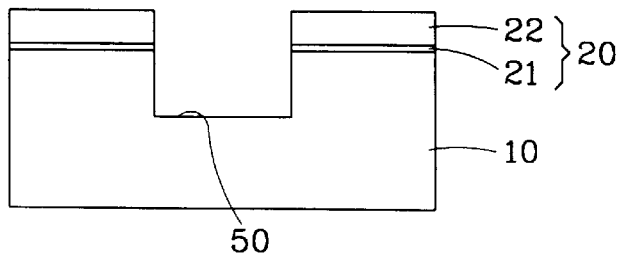

As shown in FIG. 2C, the photoresist film pattern 30 is removed, and a trench 50 is formed by etching the exposed semiconductor substrate 10 using the nitride film 22 as a hard mask.

Figure 2D:
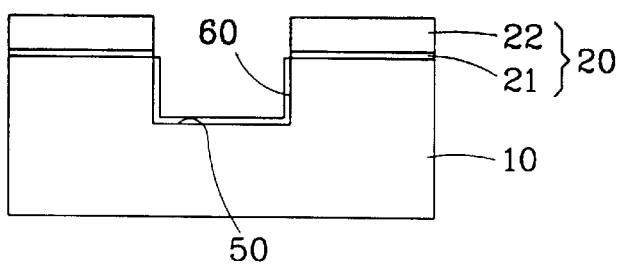

As illustrated in FIG. 2D, a second insulation film 60 is formed on an inner surface of the trench 50. The second insulation film 60 is an oxide film formed by the thermal oxidation method or the chemical vapor deposition method. The thickness of the second insulation film 60 is similar to that of the oxide film 21.

Figure 2E:
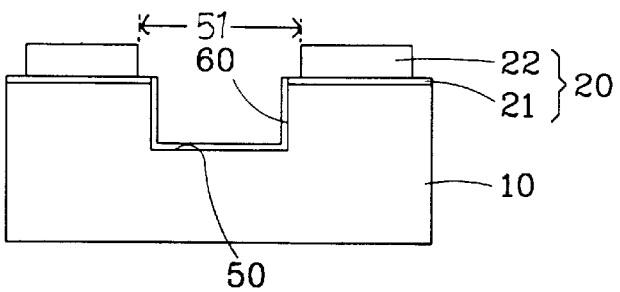

As illustrated in FIG. 2E, an opening 51 in the nitride film coinciding with the trench 50 is widened by etching the nitride 22 so that a portion of the nitride film 22 around the trench is removed. As a result, the opening 51 is wider than the trench 50. The opening 51 is widened using an etchant having a her etching selectivity with respect to the nitride film 22 than oxide film 21. Phosphoric acid, fluorine, H₂SO₄, a combination thereof or a base or acid chemical solution is used as the etchant.

Figure 2F:
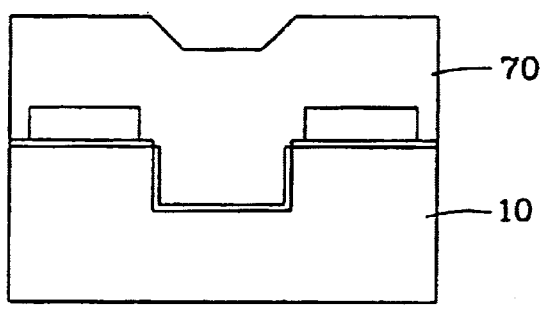
Figure 2G:
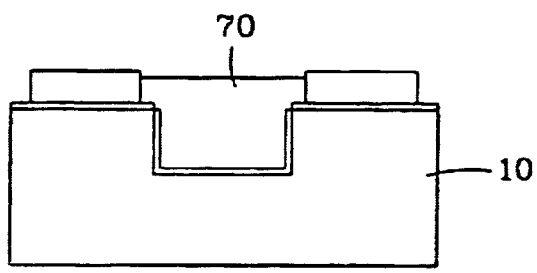

As shown in FIG. 2F, a third insulation film 70 is formed in the opening 51 and the trench 50. The third insulation film 70 is composed of one of TEOS (tetra-ethyl orthosilicate), CVD-oxide, BPSG (boronphosphorous silicate glass), a combination of nitride and oxide, or oxidized polysilicon.

Figure 2H:
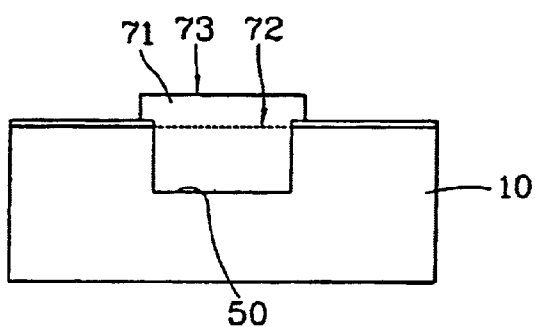

As shown in 2G, the third insulation film 70 is etched (e.g., by dry etching or chemical mechanical polishing) until a surface of the nitride film 22 is exposed. As illustrated in FIG. 2H, the nitride film 22 is then removed through wet etching. This leaves an insulation film pattern 71 (i.e., second and third insulation films 60 and 70). As shown, the insulation film pattern 71 includes integral lower and upper portions 72 and 73. The lower portion 72 fills the trench 50, and the upper portion 73 is formed on the lower portion 72 and portions of the oxide film 21 on each side of the trench 50. Accordingly, the upper portion 73 is wider than the lower portion 72.

Figure 2I:
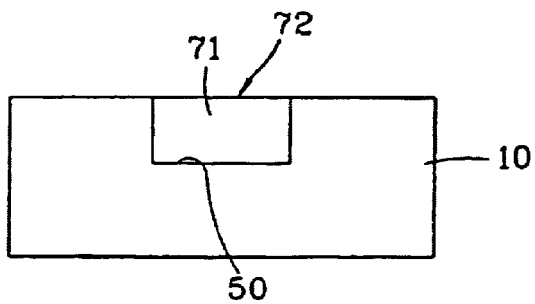

As illustrated in FIG. 2I, the oxide film 21 and the insulation film pattern 71 are etched to remove the oxide film 21 and the upper portion 73 of the insulation film pattern 71. As a result, the upper surface of the insulation film pattern 71 is planar with the surface of the semiconductor substrate 10. The oxide film 21 and the insulation film pattern 71 are etched by dry etching or chemical mechanical polishing.

During the etching process, the upper portion 73 covering the oxide film 21 protects this portion of the oxide film 21 from being etched until late in the process. Consequently, the oxide film 21 remaining near the end of the etching process acts as a protective barrier which prevents the insulation film pattern 71 at the upper side wall edges of the trench 50 from being etched.

The present invention is not limited by the embodiment described above with reference to the accompanying drawings but may be variously embodied without departing from the spirit of essential characteristics thereof. For example, the structure formed by sequentially stacking the oxide film and the nitride film can be replaced by a structure formed by sequentially stacking the oxide film and a polysilicon film or a structure formed by sequentially stacking the oxide film, a polysilicon film and the nitride film.

The above-described method for forming the isolation film in the semiconductor device according to the present invention overcomes the disadvantages of conventional methods because the insulation film is not removed from the peripheral edges of the trench, and deterioration of the gate oxide film or current leakage and the like does not occur.

It will be apparent to those skilled in the art that various modifications and variations can be made to the present invention without departing from the spirit or scope of the invention. Thus, it is intended that the present invention covers the modifications and variations of the invention provided they come within the scope of the appended claims and their equivalents.

What is claimed is:

1. A method for forming an isolation film in a semiconductor device, comprising:
   forming an insulation structure on a semiconductor substrate;
   forming a trench in the semiconductor substrate and a corresponding opening in the insulation structure;
   etching a portion of the insulation structure such that the opening of the insulation structure is wider than the trench of the substrate;
   forming an insulation film pattern which fills the trench and the opening with an insulating material; and
   etching the insulation structure so that the upper surface of the insulation structure is planar with the surface of the semiconductor substrate.

2. The method of claim 1, wherein the forming the insulation film pattern step forms insulating material over the insulating structure.

3. The method of claim 2, wherein the forming an insulation film pattern step further comprises the step of:
   etching the insulation material to expose the second insulation film.

4. The method of claim 1, wherein the insulating structure comprises:
   a first insulation film on the semiconductor substrate; and
   a second insulation film on the first insulation film.

5. The method of claim 4, wherein the etching step removes the first insulation film.

6. The method of claim 4, wherein the first insulation film is an oxide film and the second insulation film is a nitride film.

7. The method of claim 4, wherein the first insulation film is an oxide film and the second insulation film is a polysilicon film.

8. The method of claim 4, wherein the first insulation film is and oxide film and the second insulation film includes a first and second layer, said first layer being a polysilicon film and said second layer being a nitride film.

9. The method of claim 4, wherein the insulating material is one of tetra-ethyl orthosilicate, CVD-oxide, boronphosphorous silicate glass, a combination of nitride and oxide, and oxidized polysilicon.

10. The method of claim 4, wherein the insulation film pattern is one of tetra-ethyl orthosilicate, CVD-oxide, boronphosphorous silicate glass, a combination of nitride and oxide, and oxidized polysilicon.

11. The method of claim 4, prior to the forming an insulation film pattern step, further comprising:
   forming a second insulation film on a surface of said trench.

12. The method of claim 4, wherein the etching step etches the first insulation film by chemical mechanical polishing.

13. The method of claim 4, wherein the etching step etches the first insulation film by dry etching.

14. The method of claim 4, wherein the etching step etches the first insulation film and the insulation film pattern.

15. The method of claim 14, wherein the etching step etches the first insulation film and the insulation film pattern such that an upper surface of the insulation film pattern becomes planar with an upper surface of said semiconductor substrate.

16. The method of claim 4, wherein the insulation film pattern includes a lower portion formed in the trench and an upper portion formed on the lower portion and portions of the first insulation film on each side of the trench.

17. The method of claim 16, wherein the upper portion of the insulation film pattern is wider than the lower portion.

18. The method of claim 16, wherein the etching step etches the first insulation film and the insulation film pattern.

19. The method of claim 18, wherein the etching step removes the first insulation film and the upper portion of the insulation film pattern.

20. The method of claim 18, wherein the etching step etches the first insulation film and the insulation film pattern such that an upper surface of the insulation film pattern becomes planar with an upper surface of said semiconductor substrate.

21. A method for forming an isolation film in a semiconductor device, comprising:

forming an insulation structure on a semiconductor substrate, the insulation structure comprising a first insulation film on the semiconductor substrate and a second insulation film on the first insulation film;

forming a trench in the semiconductor substrate and a corresponding opening in the insulation structure;

etching a portion of the insulation structure such that the opening of the insulation structure is wider than the trench of the substrate, the etching being performed using an etchant having a higher etching selectivity to the second insulation film than to the first insulation film;

forming an insulation film pattern which fills the trench and the opening with an insulating material; and etching the insulation structure so that the upper surface of the insulation structure is planar with the surface of the semiconductor substrate.

22. The method of claim 21, wherein the first insulation film is an oxide film and the second insulation film is a nitride film.

\* \* \* \* \*